US006632683B2

(12) United States Patent
Kim et al.

(10) Patent No.: US 6,632,683 B2
(45) Date of Patent: Oct. 14, 2003

(54) METHOD FOR FORMING A CAPACITOR OF A SEMICONDUCTOR DEVICE

(75) Inventors: Kyong Min Kim, Anyang (KR); Ho-Jung Sun, Guri (KR)

(73) Assignee: Hynix Semiconductor Inc, Kyoungki-do (KR)

( * ) Notice: Subject to any disclaimer, the term of this patent is extended or adjusted under 35 U.S.C. 154(b) by 0 days.

(21) Appl. No.: 10/315,358

(22) Filed: Dec. 10, 2002

(65) Prior Publication Data

US 2003/0109103 A1 Jun. 12, 2003

(30) Foreign Application Priority Data

Dec. 10, 2001 (KR) ......................................... 2001-77852

(51) Int. Cl.$^7$ ................................................. H01G 7/06
(52) U.S. Cl. ........................................... 438/3; 438/240
(58) Field of Search ............................. 438/3, 238–240, 438/253–256, 381, 396–399

(56) References Cited

U.S. PATENT DOCUMENTS 6,365,487 B2      4/2002   Kim et al.
6,451,666 B2 *    9/2002   Hong et al. ................. 438/397

* cited by examiner

Primary Examiner—Jey Tsai
(74) Attorney, Agent, or Firm—Marshall, Gerstein & Borun

(57) ABSTRACT

Methods for forming capacitors of semiconductor devices, and more specifically, to a method for forming a capacitor having a stacked structure of metal layer-insulating film-metal layer and having its storage electrode formed of ruthenium (hereinafter, referred to as 'Ru') and dielectric layer formed of tantalum oxide ($Ta_2O_5$) film, which provides improved formation of dense Ru film using a CVD method at high temperature, thereby improving electrical characteristics of the capacitor.

17 Claims, 11 Drawing Sheets

Rms : 4.2nm

METHOD FOR FORMING A CAPACITOR OF A SEMICONDUCTOR DEVICE

BACKGROUND

1. Technical Field

Methods for forming capacitors of semiconductor devices are disclosed, and more specifically, methods are disclosed for forming capacitors having a stacked structure of metal layer-insulating film-metal layer and having its storage electrode formed of ruthenium (hereinafter, referred to as 'Ru') and dielectric layer formed of tantalum oxide ($Ta_2O_5$) film, which provides improved formation of dense Ru film using a CVD method at high temperature, thereby improving electrical characteristics of the capacitor.

2. Description of the Related Art

Currently, due to high integration of semiconductor devices, the cell size becomes smaller and the surface area of storage electrode is decreased. However, the capacitance of semiconductor devices is proportional to the surface area of storage electrode and it became difficult to obtain capacitance of capacitor sufficient for stable operation of devices.

Specifically, in case of high integration of DRAM device having a unit cell consisting of a MOS transistor and a capacitor, it is important to decrease the size of cell and increase the capacitance of capacitor.

The capacitance of a capacitor follows the equation of (Eo×Er×A)/T (Eo: permitivity of vacuum, Er: dielectric constant of dielectric film, A: surface area of capacitor, T: thickness of dielectric film). Since the capacitance of a capacitor is proportional to the area of a capacitor as in the equation, in the conventional capacitor, a dielectric film is a tantalum oxide film and a lower electrode is a polysilicon (poly-Si) layer treated with RTN (rapid thermal processing).

However, when a poly-si layer is used as the lower electrode and a $Ta_2O_5$ film is stacked on the lower electrode, oxygen atoms activated in the subsequent thermal process under oxygen gas atmosphere penetrate the $Ta_2O_5$ film to react with the poly-Si film, which is the lower electrode, thereby forming $SiO_2$. As a result, the thickness of the $Ta_2O_5$ film is increased, the thickness $T_{ox}$ of effective oxide film cannot be reduced. This makes it impossible to form an effective oxide film consisting of tantalum oxide having a thickness of about 30 Å or less. And limits the formation of a capacitor with a storage electrode using the same.

In order to solve this problem, the lower electrode formed of metal films such as Ru and TiN is suggested to reduce the thickness $T_{ox}$ of oxide film. Since, the metal films have oxidation tolerance compared to poly-Si film, the metal films are effective in reducing thee thickness $T_{ox}$ of effective oxide film.

It is known that when Ru film is used as the lower electrode and the $Ta_2O_5$ film is stacked on the Ru film, dielectric constant is four times larger than when poly-Si is used as the lower electrode even if the structure of the $Ta_2O_5$ film is changed.

A conventional method for forming a capacitor of a semiconductor device using metal film as lower electrode is described.

A lower insulating layer having a planarized top surface is formed on a semiconductor substrate. Here, the lower insulating layer comprises a device isolation film, a word line and a bit line.

A storage electrode contact hole exposing a predetermined region of the semiconductor substrate is then formed by etching the lower insulating layer.

The storage electrode contact hole is formed by etching the lower insulating layer via a photo-etching process using a storage electrode contact mask.

Next, a contact plug having a stacked structure of polysilicon film/diffusion barrier film is formed to fill the storage electrode contact hole.

A barrier metal layer is formed on a top portion of the contact plug using TiN film.

A Ru film which is a metal layer for storage electrode connected to the contact plug is formed on the entire surface of the resulting structure.

A CVD (chemical vapor deposition) method performed at a temperature of about 260° C. is used to form the Ru film. RMS (root mean square) of the Ru film for storage electrode is 4.2 nm (see FIG. 1).

Here, concerning the atomic concentration according to sputter time of Ru film, when the Ru film is formed at low temperature such as above, sputter time, i.e. the time for analyzing thin films from the surface and to the bottom in AES analysis increases. As a result, the amount of oxygen also increases and the oxygen atoms penetrate into the Ru film. Due to the penetration of oxygen atoms, the surface of the Ru film becomes rough (see FIG. 2). The plane and cross-sectional view of the Ru film may be observed through SEM (see FIGS. 3a and 3b).

When an annealing process is performed on the resulting structure under nitrogen gas atmosphere at a temperature of 600° C. for 60 seconds, RMS increases and impurities in the Ru film removed leaving empty spaces. In addition, agglomeration phenomenon, phenomenon of metals combine together like water drops due to surface tension is generated. AS a result, the surface becomes rough and a barrier metal layer is exposed.

After the annealing process, a tantalum oxide film is deposited on the Ru film. Then, a metal layer for plate electrode is formed on the Tantalum oxide film using a Ru film or a TiN film.

Here, the oxygen atoms included in the Ru film during the annealing process oxidize the interface of the barrier metal layer in the subsequent process of forming tantalum oxide films, thereby forming an oxide film, which results in degradation of electrical characteristics of capacitors of semiconductor devices and lift-off of Ru films.

As described above, the conventional method for forming a capacitor of a semiconductor device has a problem in degradation of electrical characteristics of devices due to oxygen contained in Ru films. Also, Ru films stacked at a temperature of 260° C. have low quality of film, thereby generating an agglomeration phenomenon during the subsequent annealing process to expose barrier metal layers.

SUMMARY OF THE DISCLOSURE

Accordingly, a method for forming a capacitor of a semiconductor device is disclosed wherein a Ru film is formed using a CVD method at high temperature, which provides capacitor with improved film quality and characteristics during the subsequent process.

A disclosed method for forming a capacitor of a semiconductor device comprises:

(a) forming a lower insulating film having a storage electrode contact plug on a semiconductor substrate;

(b) forming a contact plug filling the storage electrode contact hole;

(c) forming a storage electrode electrically connected to the contact plug, wherein the storage electrode is a Ru film formed using a CVD method performed at a temperature ranging from 300 to 400° C.;

(d) subjecting the surface of the storage electrode to a RTP under nitrogen gas atmosphere;

(e) forming a dielectric film on the surface of Ru film;

(f) subjecting the dielectric film to a annealing process; and (g) forming a plate electrode on the dielectric film.

In the process for forming Ru films according to this disclosure, the Ru film formation is performed in $NH_3$ gas, $O_2$ gas and Argon gas.

The Ru film is stacked at a high temperature ranging from about 300 to about 400° C., preferably from 300 to 350° C. to decrease RMS, which prevents the agglomeration phenomenon generated during the annealing process, improves quality of Ru film, minimizes oxygen content in the Ru films and inhibits formation of oxide film on the interface between Ru film and barrier metal layer, thereby improving the characteristics of the capacitors.

DETAILED DESCRIPTION OF THE PRESENTLY PREFERRED EMBODIMENTS

A disclosed method for forming a capacitor of a semiconductor device will be described in detail referring to the accompanying drawings.

FIGS. 4a to 4g are cross-sectional diagrams illustrating a method for forming a capacitor of a semiconductor device in accordance with a preferred embodiment wherein the capacitor is a cylinder-type capacitor.

Figure 1:
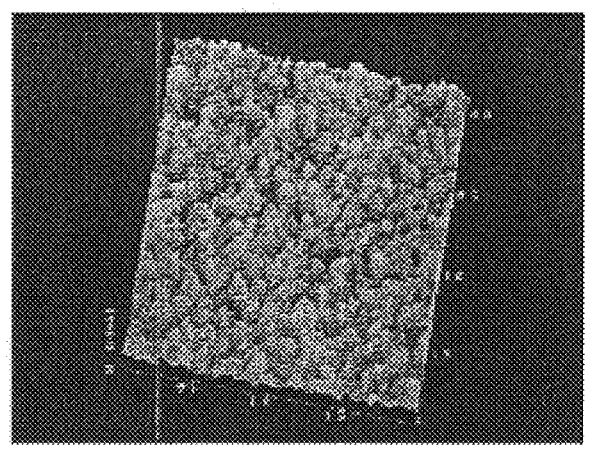
FIG. 1 is a photograph illustrating the condition of Ru film formed in accordance with the conventional art.
Figure 2:
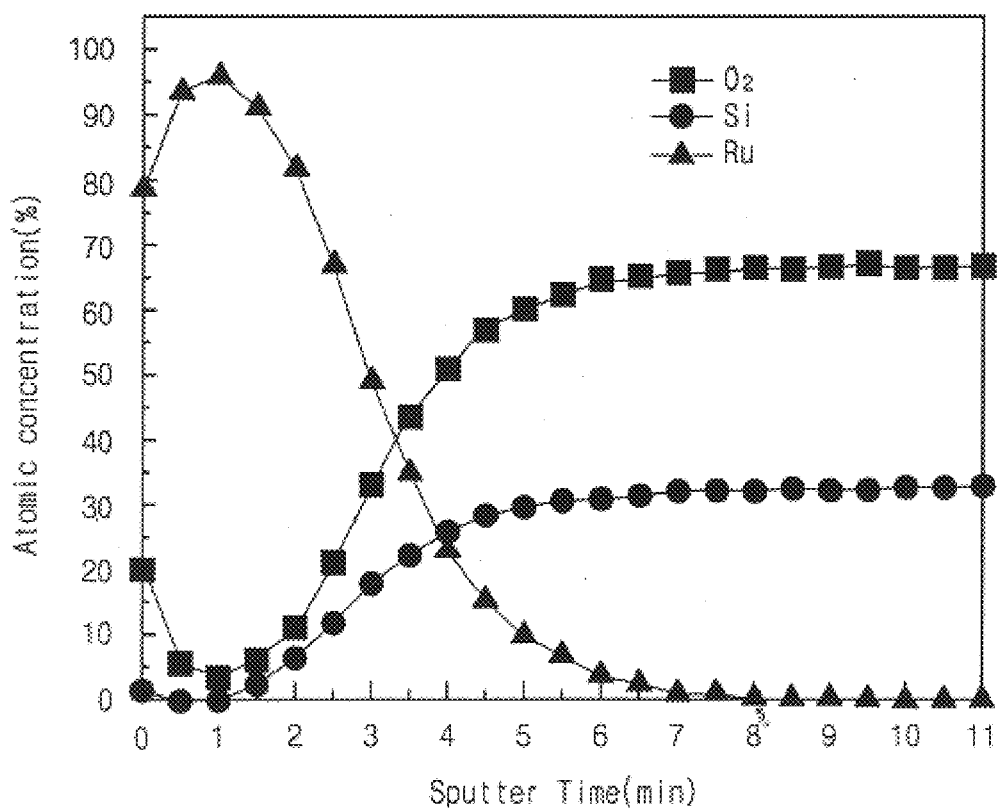
FIG. 2 is a graph illustrating atomic concentration according to sputter time during a process for stacking Ru films in accordance with the conventional art.
Figure 3A:
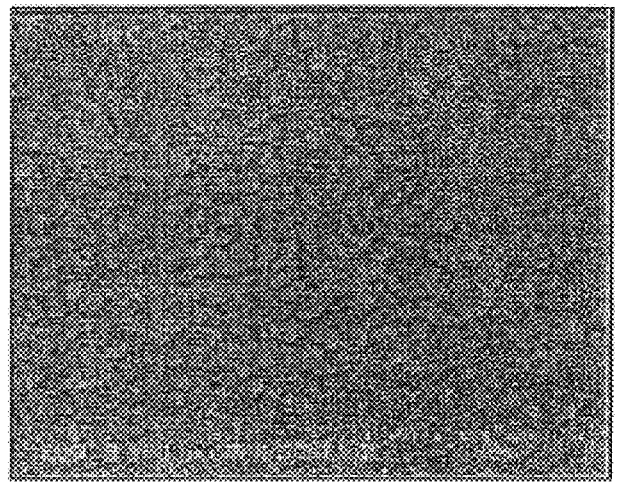
FIGS. 3a to 3b are plane and cross-sectional SEM photographs illustrating Ru films in accordance with the conventional art.
Figure 3B:
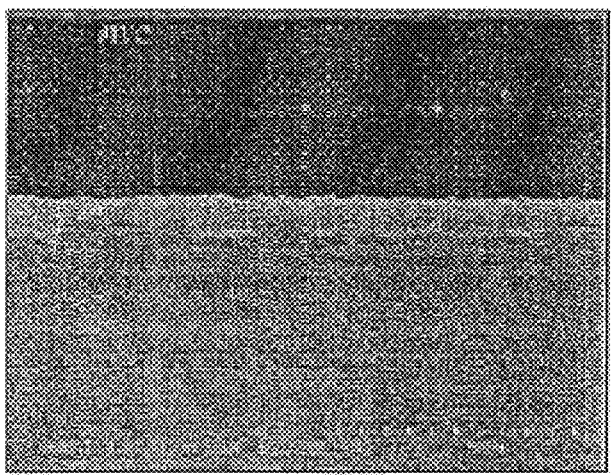
Figure 4A:
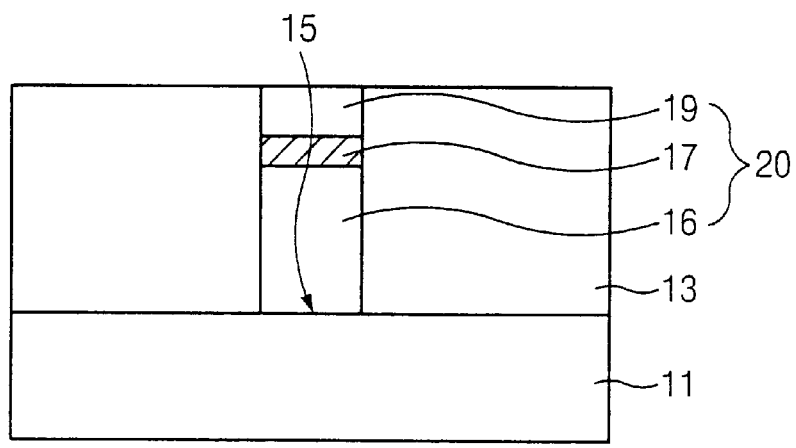
FIGS. 4a to 4g are cross-sectional diagrams illustrating a method for forming a capacitor of a semiconductor device in accordance with a preferred embodiment.

Referring to FIG. 4a, a lower insulating layer 13 is sequentially formed on the substrate 11 which comprises a device isolation film (not shown), a word line (not shown) and a bit line (not shown), and has a planarized top surface.

The lower insulating layer 13 comprises insulating materials having high fluidity such as BPSG (borophosphosiicate glass), PSG (phosphosilicate glass), FSG (fluorosilicate glass), PE-TEOS (plasma enhanced-tetraethoxysilicate glass), PE-$SiH_4$ (plasma enhanced-silane), HDP USG (high density plasma undoped silicate glass), HDP PSG (high density plasma phosphosilicate glass) and combinations thereof.

Thereafter, the lower insulating layer 13 is etched via a photo-etching process using a storage electrode contact mask to form a storage electrode contact hole 15 which exposes a predetermined portion of the substrate 11.

A contact plug 20 comprising a stacked structure of a polysilicon film 16, a Ti film 17 and a TiN film 19 is sequentially formed to fill the storage electrode contact hole 15.

Specifically, the stacked structure is formed by first forming a polysilicon film (not shown) to fill the electrode contact hole 15 and then planarizing and over-etching the polysilicon layer to remove a top portion of the polysilicon film in the contact hole 15. Next, a Ti film and a TiN film are formed on the polysilicon layer 16 and then planarized.

It is preferable that the planarization process is performed by utilizing differences in etching selectivity between the polysilicon film 16, the Ti film 17 and the TiN film 19 and the lower insulating layer 13.

In addition, the TiN film 19 is used as a barrier metal layer.

Figure 4B:
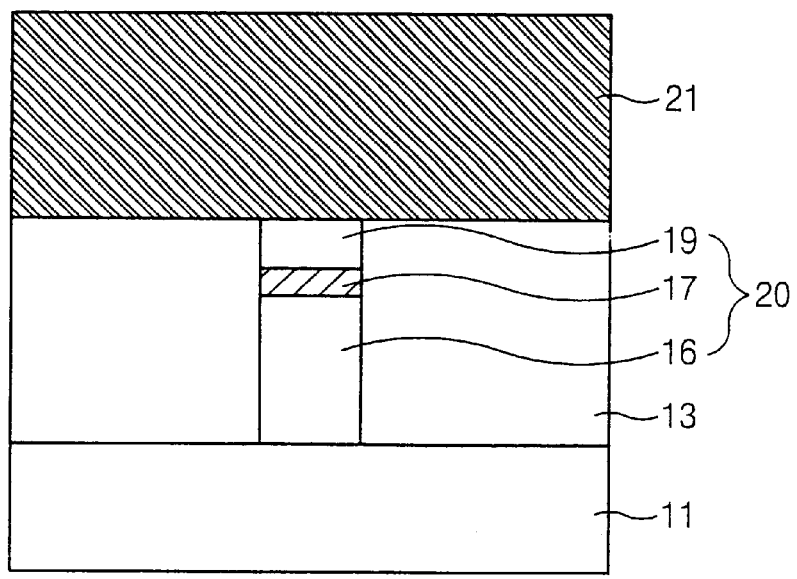

Referring to FIG. 4b, a sacrificial insulating film 21 is formed on the resultant structure.

Figure 4C:
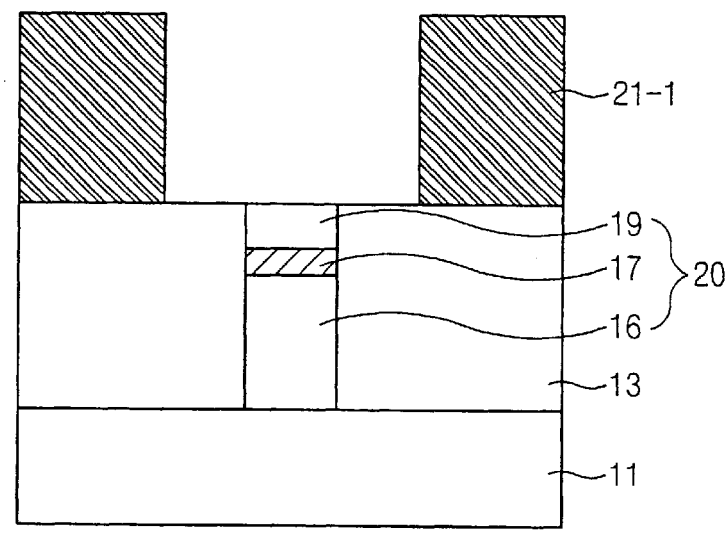

Referring to FIG. 4c, the sacrificial insulating layer 21 is etched via photo-etching process using a storage electrode mask to form a sacrificial insulating layer pattern 21-1 having a opening which exposes a contact plug 20.

Figure 4D:
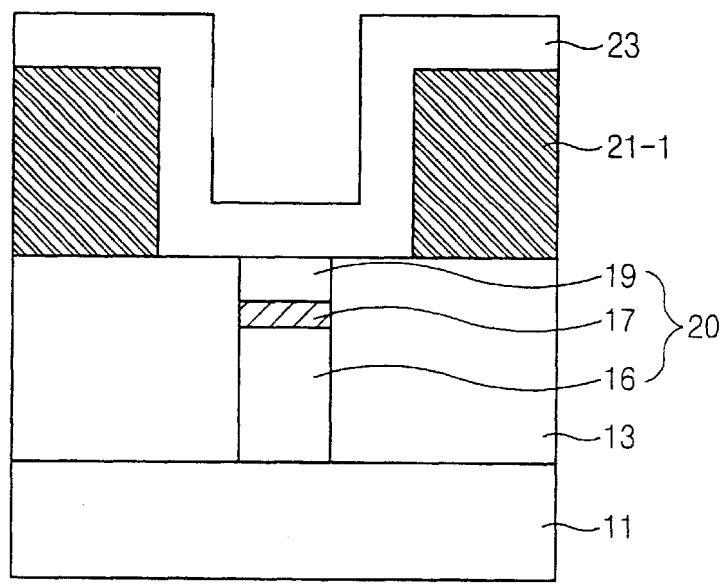

Referring to FIG. 4d, a Ru film 23 is formed on the entire surface of the resultant structure. The first Ru film 23 preferably has a thickness ranging from about 100 to about 500 Å.

Figure 5A:
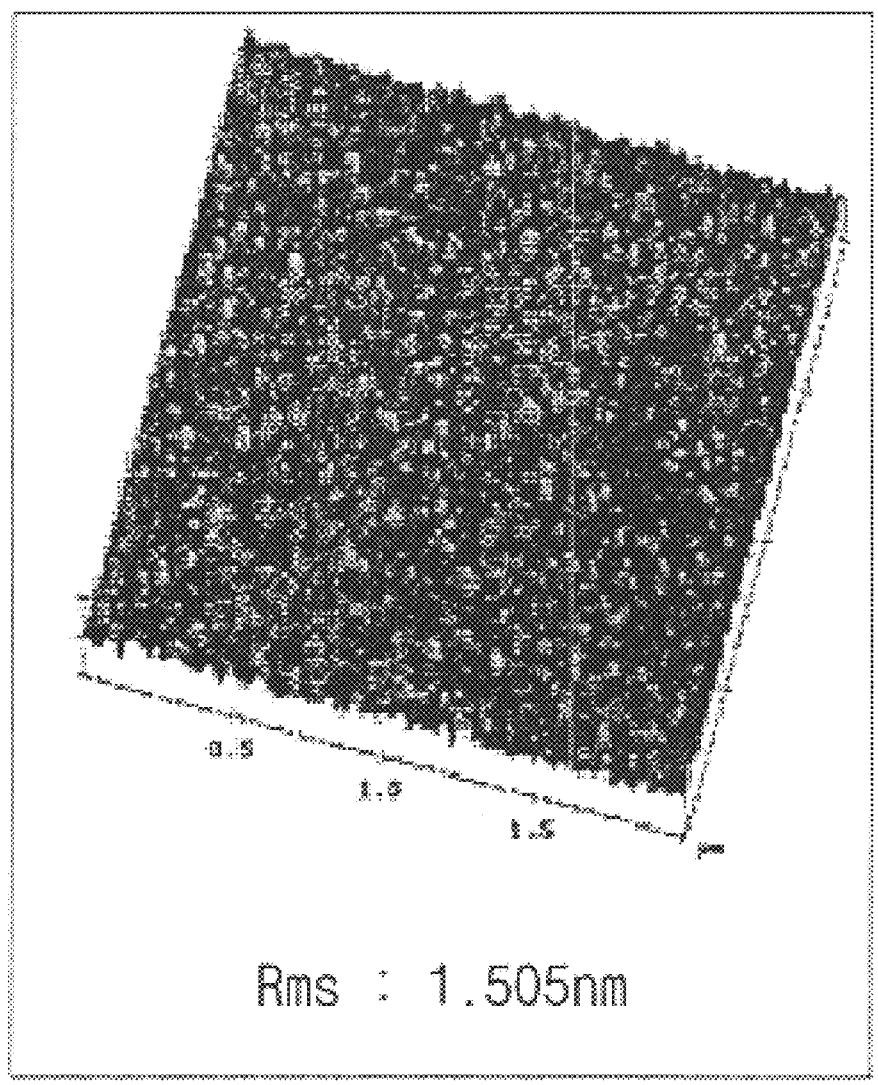
FIGS. 5a to 5b are a photograph illustrating the condition of Ru film formed and a graph illustrating atomic concentration according to sputter time during a process for stacking Ru films.

Here, it is shown that RMS of the Ru film 23 is 1.505 nm (see FIG. 5a).

Also, it is preferable that the Ru film 23 is formed using tris(2,4-octanedionato) ruthenium, bis(ethylcyclopentadienyl) ruthenium [Ru(Etcp)2], (1,3-cyclohexadiene)ruthenium and combinations thereof.

The formation process of the Ru film 23 is preferably a CVD process which is performed at a wafer temperature ranging from about 300 to about 400° C., preferably 300 to about 350° C. and under a reaction chamber pressure ranging from 200 mtorr to 10 torr by injecting Ru source material in vapor state, for examples, tris(2,4-octanedionato) ruthenium in vapor state, having a flow rate ranging from about 0.2 to about 1.0 cc/min.

Here, it is preferable that the formation process of the Ru film 23 comprises a step of employing $O_2$ as a reaction gas having a flow rate ranging from about 10 to about 50 sccm, $NH_3$ as a reaction gas having a flow rate ranging from about 100 to about 1000 sccm and Ar gas having a flow rate ranging from about 100 to about 1000 sccm.

The $NH_3$ gas is used as a deoxidation agent to remove oxygen contained in the Ru film.

Figure 5B:
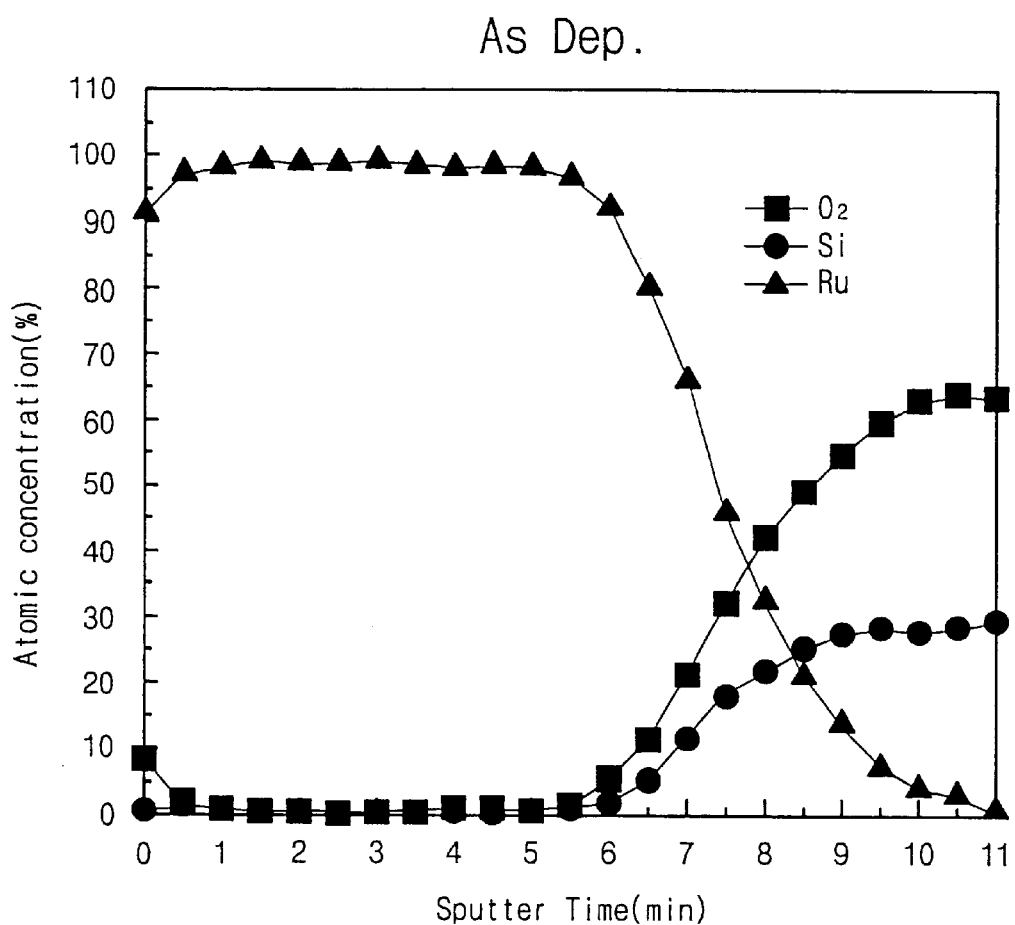

The Ru film formed at high temperature requires short sputtering time and has low oxygen content (see FIG. 5b).

Figure 7A:
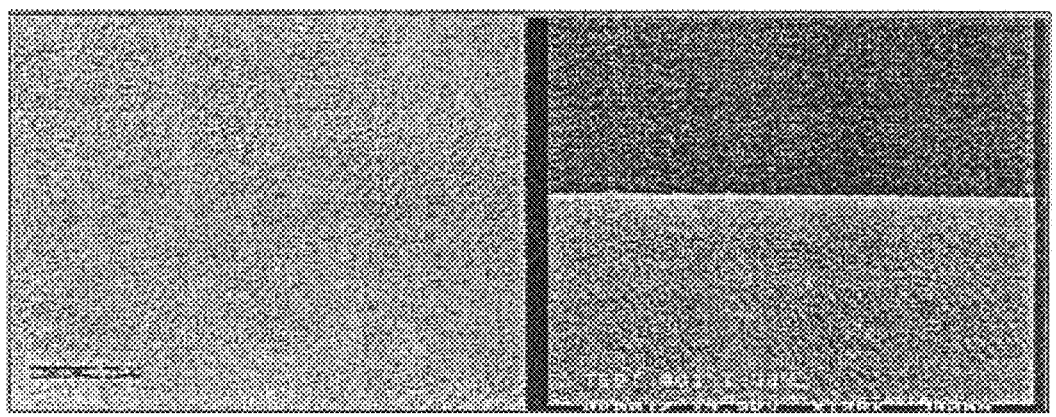
FIGS. 7a and 7b are SEM photographs illustrating Ru films formed.

The plane and cross-sectional view of the Ru film may be observed through SEM (see FIG. 7a).

Figure 4E:
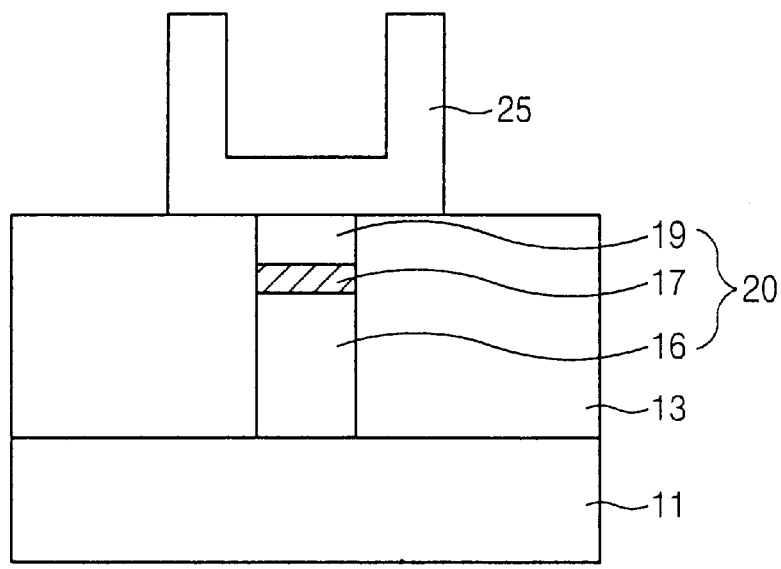
Figure 4F:
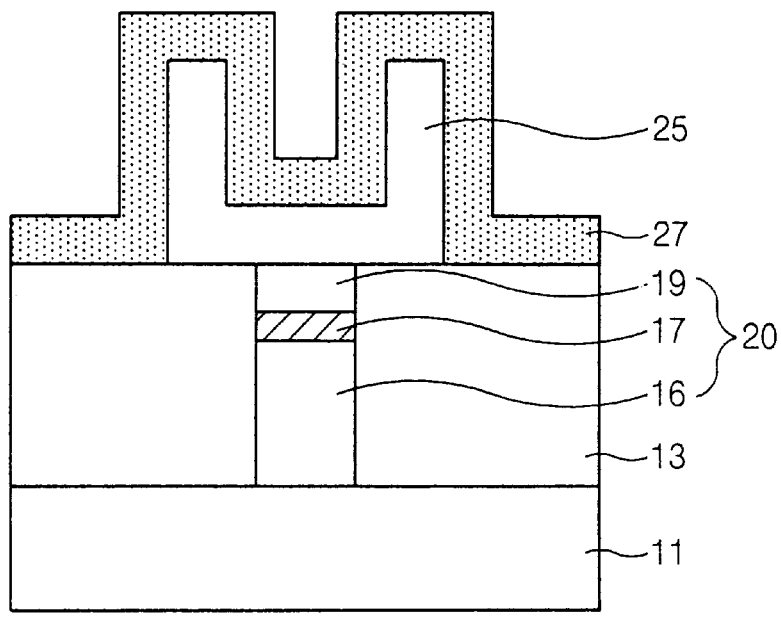

Referring FIG. 4e, the Ru film 23 on the top portion of the sacrificial insulating film pattern 21-1 is removed by a CMP process. Thereafter, the sacrificial insulating film pattern 21-1 is removed and a cylinder-type storage electrode 25 electrically connected to the contact plug 20 is formed. Here, it is preferable that the removal process is performed by utilizing differences in etching selectivity between the lower insulating layer 13 and the Ru film 23.

Thereafter, the storage electrode 25 is thermally treated via a RTP. Here, the RTP is performed at a wafer temperature ranging from about 600 to about 1000° C. and Ar, $N_2$ and NH₃ as reaction gases, each having a flow rate ranging from about 10 sccm to about 10 slm for a time period ranging from about 10 to about 300 seconds to improve surface roughness of the Ru film 23.

Figure 6A:
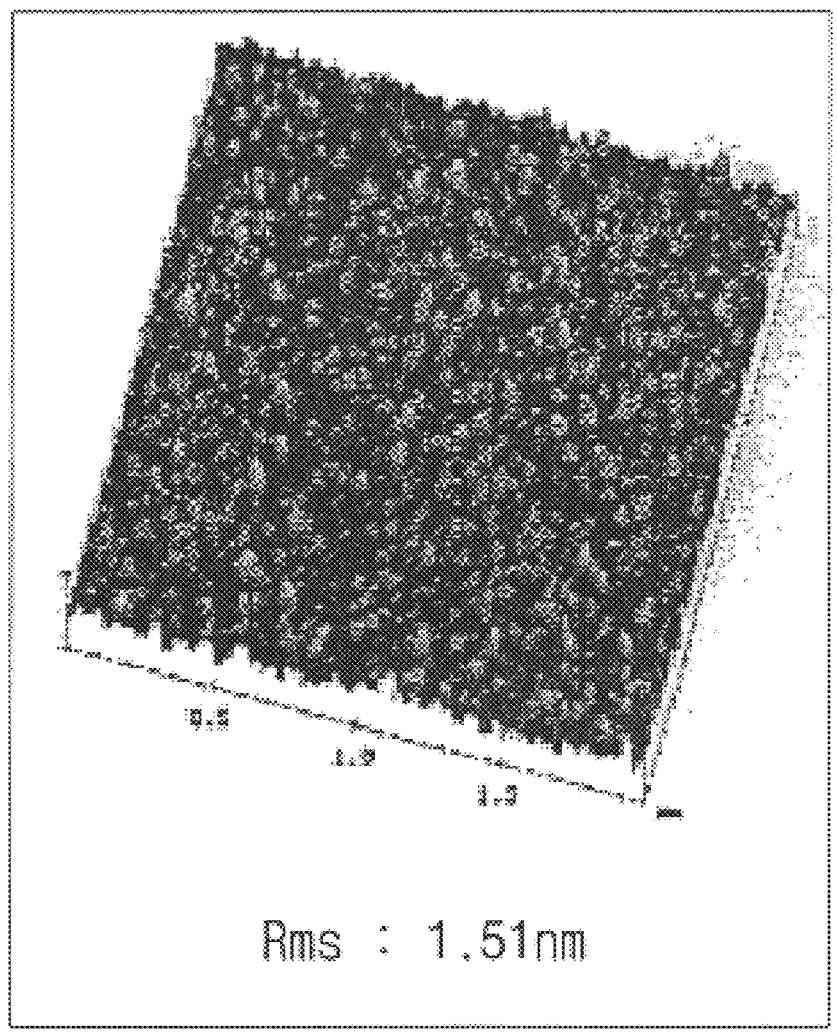
FIGS. 6a to 6b are a photograph and a graph illustrating the condition after performing a thermal treatment process under the condition of FIGS. 5a and 5b.
Figure 6B:
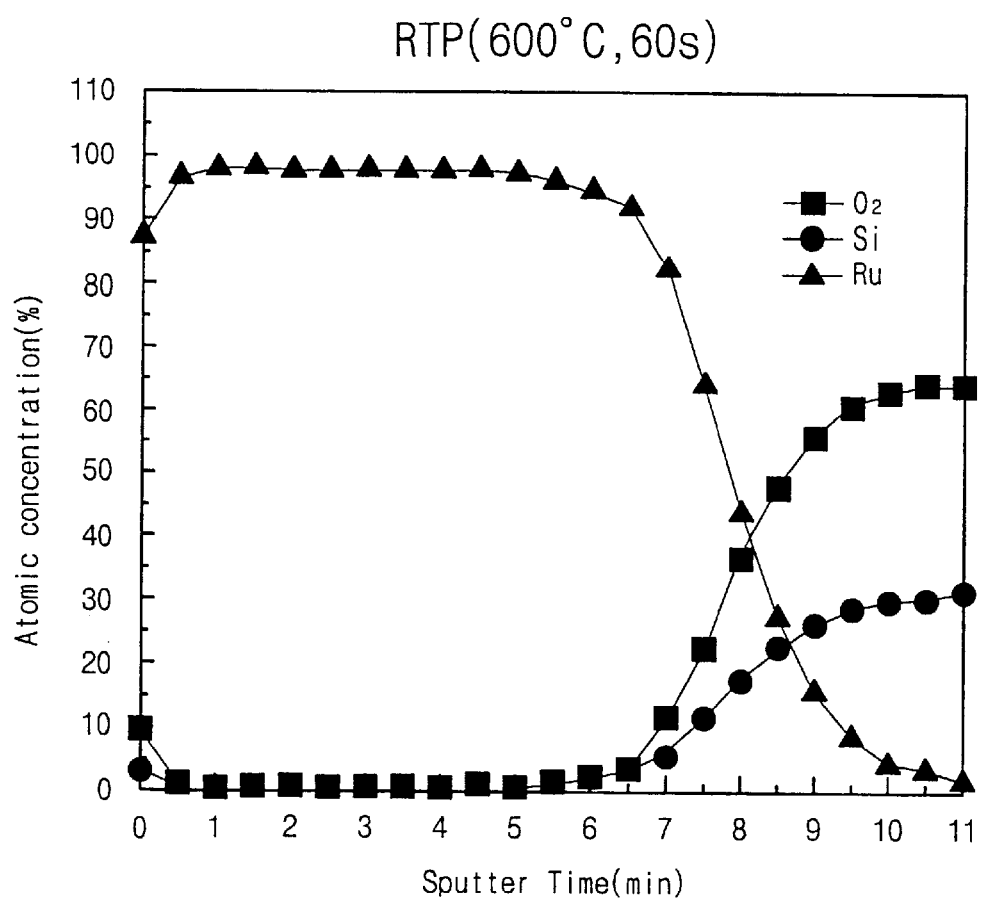
Figure 7B:
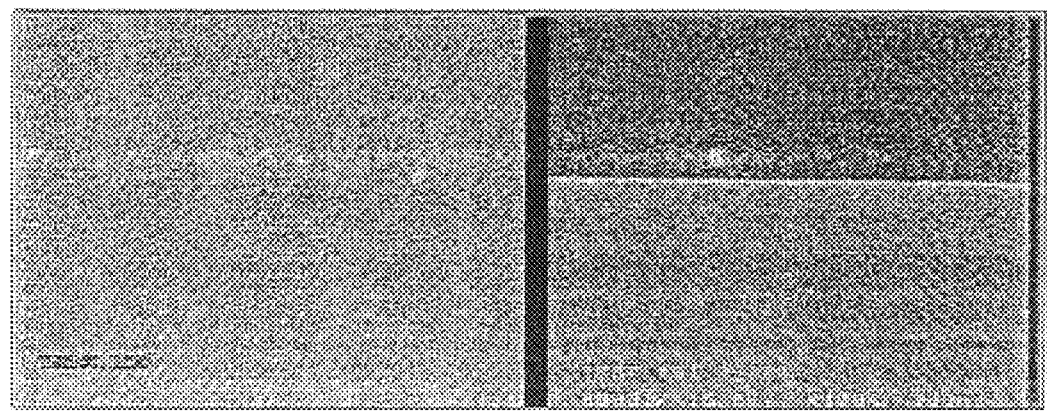

After the RTP, it is shown that RMS of the Ru film is 1.51 nm (see FIG. 6a). It should be noted that the atomic concentration after the RTP the amount of oxygen penetrating into the Ru film is almost zero due to the deoxidation process in the previous step (see FIG. 6b). It should also be noted that Ru films are neither agglomerated nor cracked before and after the annealing process via SEM of the plane and cross-sectional view of the Ru film (see FIG. 7b).

Referring 4f, a dielectric film 27 is formed on the surface of the storage electrode 25.

The dielectric film 27 is preferably a tantalum oxide film. The tantalum oxide film is preferably formed using tantalum ethylate [$TA(OC_2H_5)_5$]. Here, the dielectric film 27 may also be selected from the group consisting of BST(($BaSr)TiO_3$) film, PZT($PbZrTiO_3$) film, SBT($SrBi_2Ta_2O_9$) film, BLT ($Bi_{(4-x)}La_xTi_3O_{12}$) film and combinations thereof.

The formation process of the electric film 27 is performed at wafer temperature ranging from about 300 to about 400° C. and under reaction chamber pressure ranging from about 0.1 to about 2.0 torr by injecting source material vaporized in a vaporizer at temperature ranging from about 170 to about 190° C. Here, $O_2$ gas having a flow rate ranging from about 10 to about 1000 sccm is used as a reaction gas.

It is preferable that a process selected from the group consisting of plasma treatment process, furnace treatment process, RTP and combinations thereof is performed after the formation process of the dielectric film 23.

For example, the plasma treatment process may be one of $N_2+O_2$ plasma or $O_2/N_2O/O_3$ gas plasma treatment process and UV/$O_3$ plasma at a temperature ranging from 300 to 500° C. Thereafter, the furnace treatment process or RTP treatment process is performed under nitrogen gas atmosphere at a temperature ranging from about 500 to about 700° C.

Figure 4G:
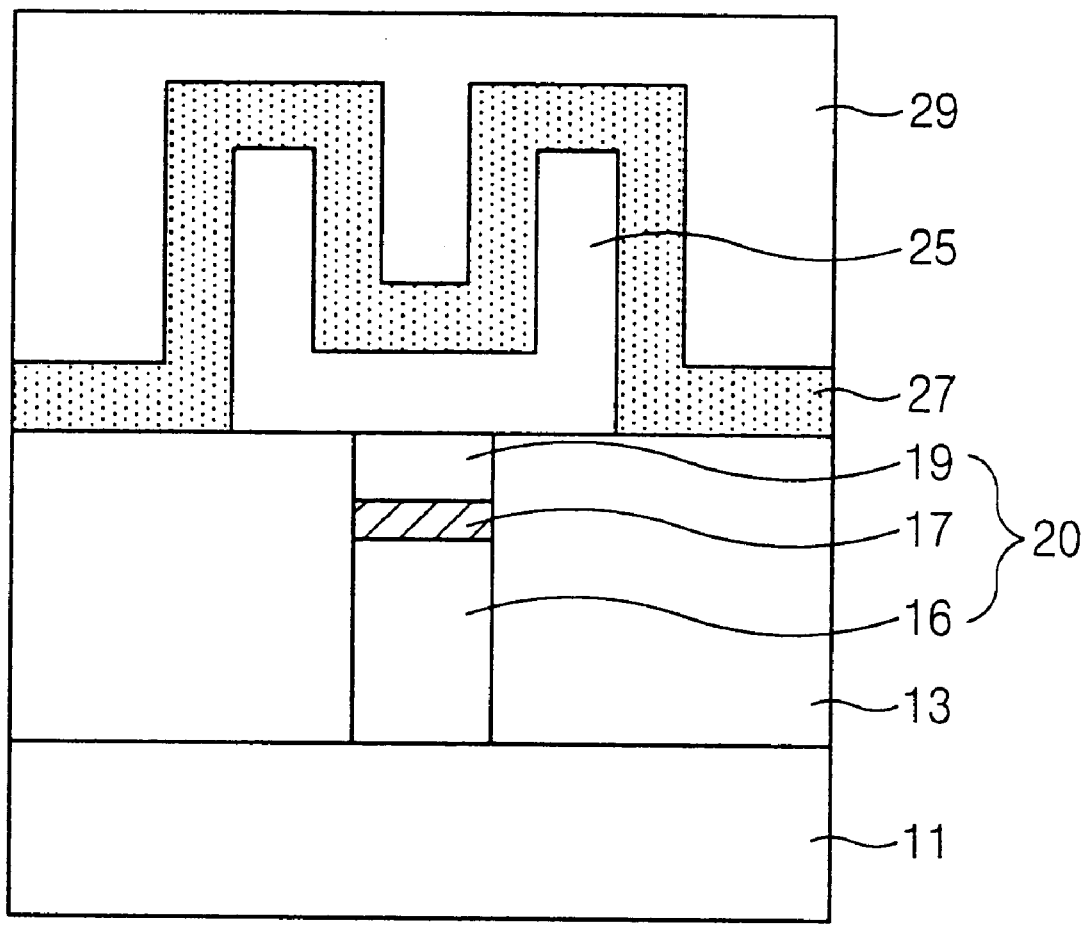

Referring to FIG. 4g, a plate electrode 29 is formed on the dielectric film 27 using a TiN film or a Ru film.

As described above, the method for forming a capacitor of a semiconductor device reduces surface roughness and inhibits the exposure of barrier metal layer due to the agglomeration phenomenon during the subsequent annealing process by forming Ru films at high deposition temperature of over 300° C., thereby preventing degradation electrical characteristics of devices.

What is claimed is:

1. A method for forming a capacitor of a semiconductor device, the method comprising:
   (a) forming a lower insulating film having a storage electrode contact hole on a semiconductor substrate;
   (b) forming a contact plug filling the storage electrode contact hole;
   (c) forming a storage electrode electrically connected to the contact plug, wherein the storage electrode is a Ru film formed using a CVD method performed at a temperature ranging from 300 to 400° C.;
   (d) subjecting the surface of the storage electrode to a RTP under nitrogen gas atmosphere;
   (e) forming a dielectric film on the Ru film;
   (f) subjecting the dielectric film to a annealing process; and
   (g) forming a plate electrode on the dielectric film.

2. The method according to claim 1, wherein the storage electrode is formed using a CVD method performed at a temperature ranging from 300 to 350° C.

3. The method according to claim 1, wherein the contact plug comprises a stacked structure of polysilicon film, Ti film and TiN film.

4. The method according to claim 1, wherein the source material of storage electrode of the step (c) is selected from the group consisting of tris(2,4-octanedionato) ruthenium, bis(ethylcyclopentadienyl) ruthenium [$Ru(Etcp)_2$], (1,3-cyclohexadiene)ruthenium and combinations thereof.

5. The method according to claim 1, wherein the step of forming a storage electrode of the step (c) is performed at wafer temperature ranging from 300 to 400° C. and under reaction chamber pressure ranging from 200 mtorr to 10 torr by injecting vaporized gas of Ru source material having a flow rate ranging from 0.2 to 1.0 cc/min.

6. The method according to claim 1, wherein the step of forming a storage electrode of the step (c) is performed by injecting $O_2$ gas having a flow rate ranging from 10 to 50 sccm, $NH_3$ gas having a flow rate ranging from 100 to 1000 sccm and Ar gas having a flow rate ranging from 100 to 1000 sccm.

7. The method according to claim 1, wherein the storage electrode has a thickness ranging from 100 to 500 Å.

8. The method according to claim 1, wherein the step of subjecting the surface of the storage electrode to a RTP is performed at a temperature ranging from 600 to 1000° C. and with Ar gas, $N_2$ gas and $NH_3$ gas each having a flow rate ranging from 10 sccm to 10 slm for a time period ranging from 10 to 300 seconds.

9. The method according to claim 1, wherein the dielectric film is a tantalum oxide film.

10. The method according to claim 1, wherein the dielectric film is selected from the group consisting of BST(($BaSr)TiO_3$) film, PZT($PbZrTiO_3$) film, SBT($SrBi_2Ta_2O_9$) film, BLT($Bi_{(4-x)}La_xTi_3O_{12}$) film and combinations thereof.

11. The method according to claim 1, wherein the step of forming a dielectric film is performed at wafer temperature ranging from 300 to 400° C. and under reaction chamber pressure ranging from 0.1 to 2.0 torr by injecting source material vaporized in a vaporizer at temperature ranging from 170 to 190° C.

12. The method according to claim 11, wherein the step of forming a dielectric film is performed by injecting $O_2$ gas as reaction gas having a flow rate ranging from 10 to 1000 sccm.

13. The method according to claim 1, wherein the step of subjecting the dielectric film to a annealing process is a process selected from the group consisting of plasma treatment process, furnace treatment process, RTP and combinations thereof.

14. The method according to claim 13, wherein the plasma treatment process is performed using $N_2+O_2$ plasma at a temperature ranging from 300 to 500° C.

15. The method according to claim 13, wherein the plasma treatment process is performed using $O_2/N_2O/O_3$ gas plasma treatment process and UV/$O_3$ gas plasma treatment process.

16. The method according to claim 13, wherein the furnace treatment process and RTP are performed under nitrogen gas atmosphere at a temperature ranging from 500 to 700° C.

17. The method according to claim 1, wherein the plate electrode comprises a TiN film or a Ru film.

* * * * *

UNITED STATES PATENT AND TRADEMARK OFFICE
CERTIFICATE OF CORRECTION

PATENT NO. : 6,632,683 B2  Page 1 of 1
DATED : October 14, 2003
INVENTOR(S) : Kyong-Min Kim et al.

It is certified that error appears in the above-identified patent and that said Letters Patent is hereby corrected as shown below:

<u>Title page,</u>
Item [75], Inventors, please delete "Anyang" and replace it with -- Kyoungki-do --; and please delete "Guri" and replace it with -- Kyoungki-do --.

<u>Column 6,</u>
Line 14, please delete "400°C." and replace it with -- 400°C, --.

Signed and Sealed this

Seventeenth Day of February, 2004

JON W. DUDAS
*Acting Director of the United States Patent and Trademark Office*